United States Patent
Kawanami

(10) Patent No.: US 7,227,427 B2
(45) Date of Patent: Jun. 5, 2007

(54) THREE-PORT NONRECIPROCAL CIRCUIT DEVICE, COMPOSITE ELECTRONIC COMPONENT, AND COMMUNICATION APPARATUS

(75) Inventor: Takashi Kawanami, Ishikawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 140 days.

(21) Appl. No.: 10/546,205

(22) PCT Filed: Feb. 10, 2004

(86) PCT No.: PCT/JP2004/001436

§ 371 (c)(1),
(2), (4) Date: Aug. 18, 2005

(87) PCT Pub. No.: WO2004/084338

PCT Pub. Date: Sep. 30, 2004

(65) Prior Publication Data

US 2006/0132255 A1 Jun. 22, 2006

(30) Foreign Application Priority Data

Mar. 18, 2003 (JP) ............................. 2003-074269

(51) Int. Cl.
*H01P 1/32* (2006.01)
(52) U.S. Cl. ....................... 333/1.1; 333/24.2
(58) Field of Classification Search .............. 333/1.1, 333/24.2
See application file for complete search history.

(56) References Cited

U.S. PATENT DOCUMENTS

2005/0190007 A1* 9/2005 Kawanami ................... 333/1.1

FOREIGN PATENT DOCUMENTS

| JP | 2002-299915 | 10/2002 |
| JP | 2003-258509 | 9/2003 |

OTHER PUBLICATIONS

The International Search Report, with English Language Translation, filed for the parent PCT Application.

* cited by examiner

*Primary Examiner*—Stephen E. Jones
(74) *Attorney, Agent, or Firm*—Dickstein, Shapiro, LLP.

(57) ABSTRACT

A center-electrode assembly (13) has a configuration in which center electrodes (21) to (23) are arranged, in an electrically insulated state, at the upper surface of a circular-plate microwave ferrite (20). The center electrode (21) is constituted by a first line conductor (21a) and a second line conductor (21b) which are arranged parallel to each other. The hot ends of the first line conductor (21a) and the second line conductor (21b) have connection portions (27) and (26), respectively, and the cold ends are connected to a ground electrode (25). The first and second line conductors (21a) and (21b) are arranged such that the hot end of the first line conductor (21a) and the cold end of the second line conductor (21b) oppose each other and the cold end of the first line conductor (21a) and the hot end of the second line conductor (21b) oppose each other to cause electromagnetic coupling.

20 Claims, 16 Drawing Sheets

THREE-PORT NONRECIPROCAL CIRCUIT DEVICE, COMPOSITE ELECTRONIC COMPONENT, AND COMMUNICATION APPARATUS

TECHNICAL FIELD

The present invention relates to a three-port nonreciprocal circuit device, such as an isolator, used in a microwave band and also relates to a composite electronic component and a communication apparatus.

BACKGROUND ART

Conventionally, a balun, hybrid, or power combiner is provided at the output side of a balanced output circuit, particularly, a push-pull amplifier (having a pair of amplifiers that operate at a phase difference of 180°). The balun or the like converts a balanced signal into a single-ended signal.

In generally, baluns are used in the microwave band and lower (the HF band, VHF band, UHF band, and lower). On the other hand, hybrids or power combiners are used in the microwave band and higher (the UHF band and higher). Wideband ferrite cores are often used for the baluns, in which case, the available frequency upper limit is the UHF band. Typically, hybrids or power combiners are configured with distributed-constant circuits. Thus, the sizes do not cause a significant problem in practice, for the UHF band or higher.

Meanwhile, in a communication apparatus, particularly, in a transmission circuit section for QPSK or the like involving amplitude modulation components or in a transmission circuit section that requires high reliability, a transmission signal converted into a single-ended signal is sent through an isolator and then through an antenna switching device (or antenna duplexer) and the resulting signal is sent to an antenna. Unless the signal is sent through the isolator, reflections from the antenna and the antenna switching device return to a balanced output circuit (especially, amplifiers), thereby varying load impedance viewed from the balanced output circuit. When the load impedance varies, some problems arise. For example, the waveform distortion of the transmission signal becomes severe and the operation of the amplifiers becomes unstable for oscillation.

However, when a balun (or a hybrid or a power combiner) and an isolator are combined as in the conventional manner, the size and cost of the transmission circuit section increase, thereby making it impossible to meet recent demands for miniaturization and cost reduction of mobile communication apparatuses. Also, since a transmission signal passes through both the balun and the isolator, the insertion loss is increased. Further, since the transmission circuit section handles a large amount of power, when the number of connection portions increases as a result of an increase in the number of components, there are problems in that unwanted radiation is easily produced and the possibility of mutual interference in the communication apparatus increases. In addition, since the operating bandwidths of the balun and the isolator reduce the operating bandwidth of the transmission circuit section, there is a problem in that the available frequency band is reduced.

Accordingly, as described in Japanese Unexamined Patent Application Publication No. 2002-299915, the present inventor proposed a nonreciprocal circuit device that can be connected to a balanced output circuit without a balun, hybrid, or the like interposed therebetween and also proposed a communication apparatus. In the nonreciprocal circuit device, two opposite ends of a center electrode for one port are configured as hot ends, and balanced input and unbalanced output are employed. The nonreciprocal circuit device can be used to combine outputs from a push-pull amplifier. However, with the circuit device, in the case of a low operating point (an operating point at which the amount of bias current, i.e., idling current, is small), reverse-phase excitation current does not effectively flow through a reverse-phase-side input terminal. Thus, a problem has been found in that the ferrite excitation efficiency is insufficient.

DISCLOSURE OF INVENTION

Accordingly, an object of the present invention is to provide a three-port nonreciprocal circuit device that is connectable to a balanced output circuit without a balun, hybrid, or the like interposed therebetween and that can reliably excite a ferrite even operated at a low operating point and to provide a composite electronic component and a communication apparatus including the circuit device.

To achieve the foregoing object, a three-port nonreciprocal circuit device according to the present invention includes:

(1) a permanent magnet;

(2) a ferrite to which a direct-current magnetic field is applied by the permanent magnet; and (3) a first center electrode, a second center electrode, and a third center electrode arranged so as to cross one another in an electrically insulated state.

(4) The circuit device is characterized in that at least one of the first to third center electrodes is constituted by a first line conductor and a second line conductor which are arranged substantially parallel to each other, a hot end of the first line conductor and a cold end of the second line conductor oppose each other and a cold end of the first line conductor and a hot end of the second line conductor oppose each other to cause electromagnetic coupling, and a port formed between the hot end of the first line conductor and the hot end of the second line conductor is a balanced port.

More specifically, preferably, each of the first and second line conductors is constituted by at least two lines. Preferably, an electrical length from the hot end of the first line conductor of the center electrode, constituted by the first line conductor and the second line conductor, to the hot end of the second line conductor is substantially one-half a wavelength.

The three-port nonreciprocal circuit device having the above-described configuration can be connected to the output side of a balanced output circuit without a balanced-to-unbalanced converter, such as a balun, hybrid, or the like interposed therebetween.

Also, in order to achieve impedance matching between the three-port nonreciprocal circuit device and a balanced output circuit that is connected thereto, for example, a matching capacitor is electrically connected in series with the hot end of first line conductor for the balanced port and a matching capacitor is electrically connected in series with the hot end of the second line conductor for the balanced port, a matching capacitor provides electrical connection between the hot end of the first line conductor and the hot end of the second line conductor, or a matching capacitor provides electrical connection between the hot end of the first line conductor and ground and a matching capacitor provides electrical connection between the hot end of the second line conductor and ground. Alternatively, the hot end of the first line conductor and the hot end of the second line conductor are electrically connected to balanced input/output terminals via respective matching capacitors, matching capacitors provide electrical connection between the balanced input/output terminals, or matching capacitors are electrically connected between the balanced input/output terminals and corresponding grounds.

Varying the line width of the first line conductor and the second line conductor of the center electrode for the balanced port from the line widths of the other center electrodes can achieve optimum impedance matching between the nonreciprocal circuit device and the balanced output circuit. In particular, when the impedance of the balanced output circuit is low, increasing the line width of the first line conductor and the second line conductor relative to the line widths of the other center electrodes can reduce conduction loss and can provide a nonreciprocal circuit device having low insertion loss.

A communication apparatus according to the present invention includes the nonreciprocal circuit device having the above-described features and one pair of amplifiers that are driven at a phase difference of substantially 180°. The balanced port of the three-port nonreciprocal circuit device is connected to the balanced output terminals of the pair of amplifiers. With the above-described configuration, it is possible to provide a compact communication apparatus having superior frequency characteristics.

According to the present invention, since the balanced input/output terminals are provided, the three-port nonreciprocal circuit device can be connected to a balanced circuit without a balanced-to-unbalanced converter interposed therebetween. More specifically, the balanced input terminals of the three-port nonreciprocal circuit device can be connected to the balanced output terminals of the amplifiers that are driven at a phase difference of substantially 180°. As a result, it is possible to provide a compact communication apparatus having superior frequency characteristics. Further, since the cold ends of the input-side center electrode are ground independently from each other, even when the amplifiers that drive the respective input ports are operated at a low operating point (even when not all waves are amplified), the ferrite can be reliably excited.

BEST MODE FOR CARRYING OUT THE INVENTION

Figure 1:
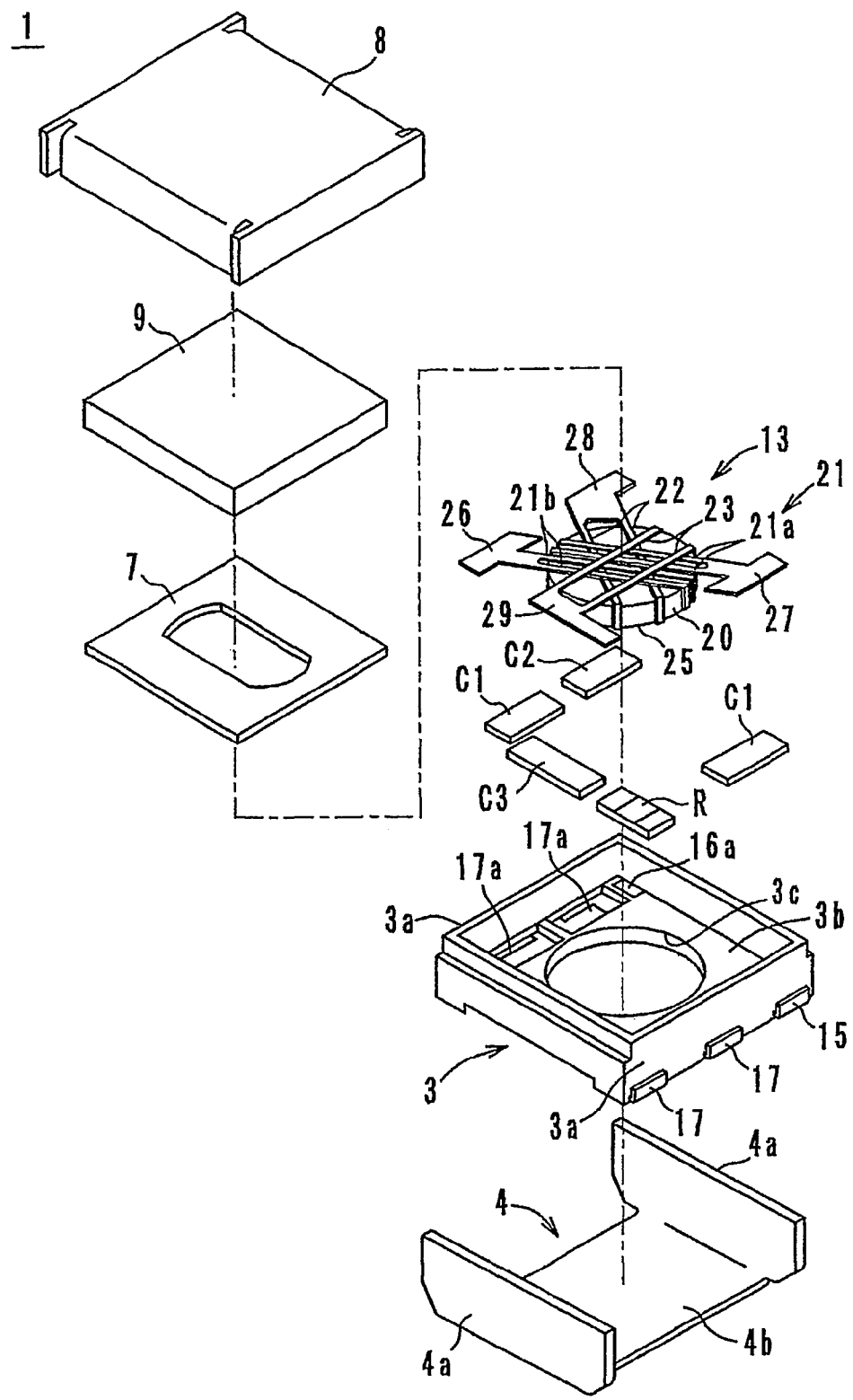
FIG. 1 is an exploded perspective view of one embodiment of a three-port nonreciprocal circuit device according to the present invention.

Embodiments of a three-port nonreciprocal circuit device, a composite electronic component, and a communication apparatus according to the present invention will be described below with reference to the accompanying drawings. In each embodiment, an example of a lumped-element isolator will be described as a three-port nonreciprocal circuit device. The same components and the same portions are denoted with the same reference numerals and redundant descriptions will not be given.

First Embodiment, FIGS. 1 to 9

As shown in FIG. 1, an isolator 1 generally includes a lower metal casing 4, a resin terminal casing 3, a center-electrode assembly 13, an upper metal casing 8, a permanent magnet 9, an insulating member 7, a resistor R, matching capacitors C1 to C3, and so on.

The center-electrode assembly 13 is configured such that center electrodes 21 to 23 are arranged, in an electrically insulated state, at the upper surface of a circular-plate microwave ferrite 20 such that the angle of crossing one another is substantially 120°. The hot ends of the center electrodes 22 and 23 have connection portions 28 and 29, respectively, and the cold ends are connected to a ground electrode 25.

The center electrode 21 is constituted by a first line conductor 21a and a second line conductor 21b which are arranged parallel to each other. The hot ends of the first line conductor 21a and the second line conductor 21b have connection portions 27 and 26, respectively, and the cold ends are connected to the ground electrode 25. The first and second line conductors 21a and 21b are arranged such that the hot end of the first line conductor 21a and the cold end of the second line conductor 21b oppose each other and the cold end of the first line conductor 21a and the hot end of the second line conductor 21b oppose each other to cause electromagnetic coupling.

The line conductors 21a and 21b and the center electrodes 22 and 23 are each constituted by two lines. In particular, constituting each of the line conductors 21a and 21b by two lines combines the effects of exciting the ferrite 20, thereby allowing efficient excitation of the ferrite. As a result, the insertion loss decreases and a high-efficient transmission system can be achieved.

The ground electrode 25 common to the center electrode 21, 22, and 23 is provided so as to substantially cover the lower surface of the ferrite 20. The ground electrode 25, which is provided on the reverse surface of the ferrite 20, is connected to a button wall 4b of the lower metal casing 4 through a window portion 3c of the resin terminal casing 3 by a method such as soldering or the like, thereby connecting the center-electrode assembly 13 to ground.

Figure 2:
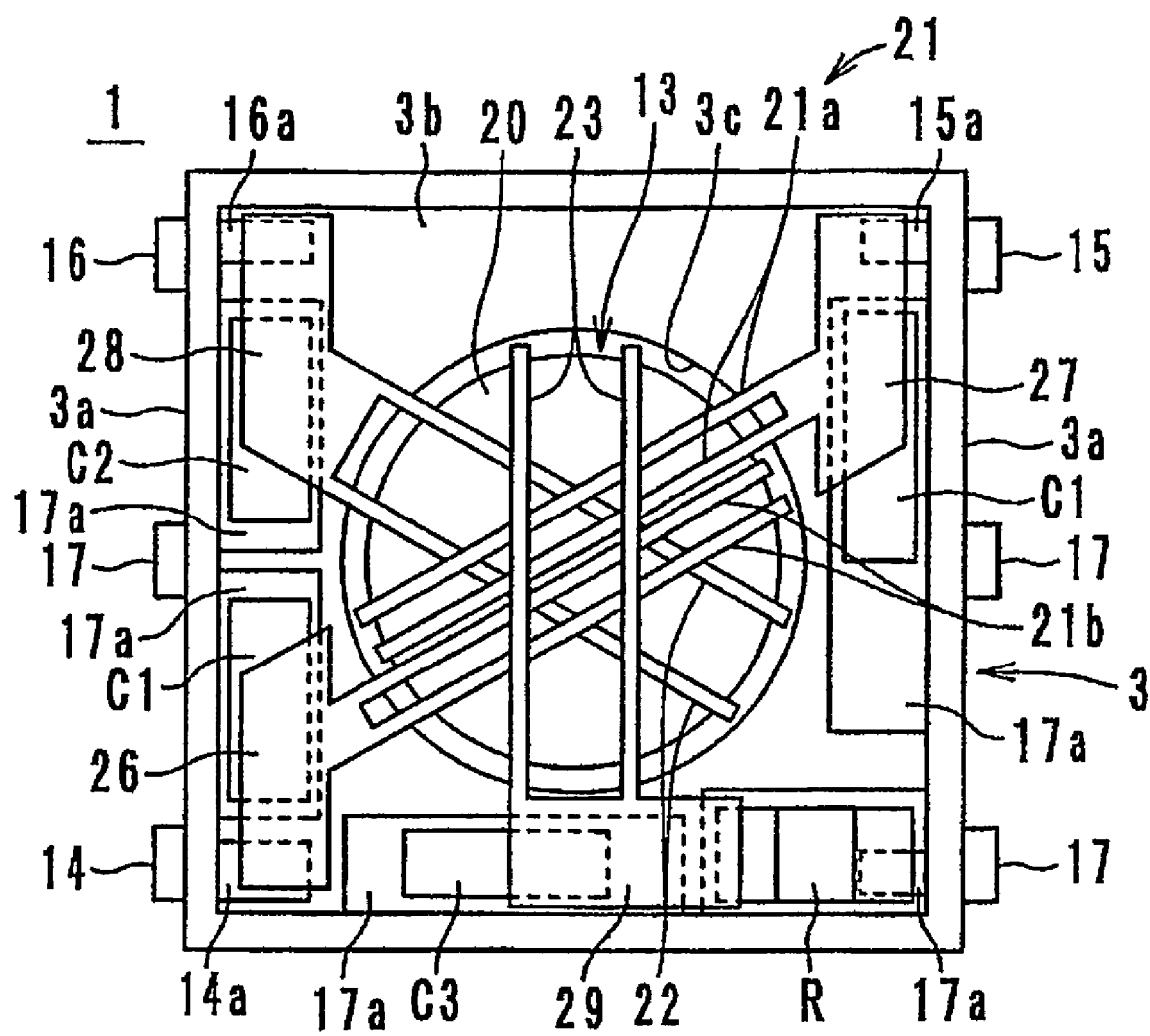
FIG. 2 is an internal plan view of the three-port nonreciprocal circuit device shown in FIG. 1.

As shown in FIG. 2, balanced input terminals (=balanced input terminals=differential input terminals) 14 and 15, an unbalanced output terminal (=unbalanced output terminal) 16, and three ground terminals 17 are insert-molded into the resin terminal casing 3. One end of each of the terminals 14 to 17 is extracted from opposing sidewalls 3a of the resin terminal casing 3 toward the outside, and the other ends of the terminals 14 to 17 are exposed at a bottom portion 3b of the resin terminal casing 3 to form balanced input extracting electrode portions 14a and 15a, an unbalanced output extracting electrode portion 16a, and ground extracting electrode portions 17a, respectively. The balanced input extracting electrode portions 14a and 15a and the unbalanced output extracting electrode portion 16a are soldered, respectively, to the connection portions 26, 27, and 28 of the center electrodes 21 and 22.

Each of the matching capacitor C1 to C3 is a single-plate capacitor in which a hot-side capacitor electrode and a cold-side capacitor electrode are provided on the obverse and reverse surfaces of a dielectric substrate. The hot-side capacitor electrodes are soldered to the corresponding connection portions 26 to 29 of the center electrodes 21 to 23 and the cold-side capacitor electrodes are soldered to the ground extracting electrode portions 17a, which are exposed at the resin terminal casing 3.

Figure 3:
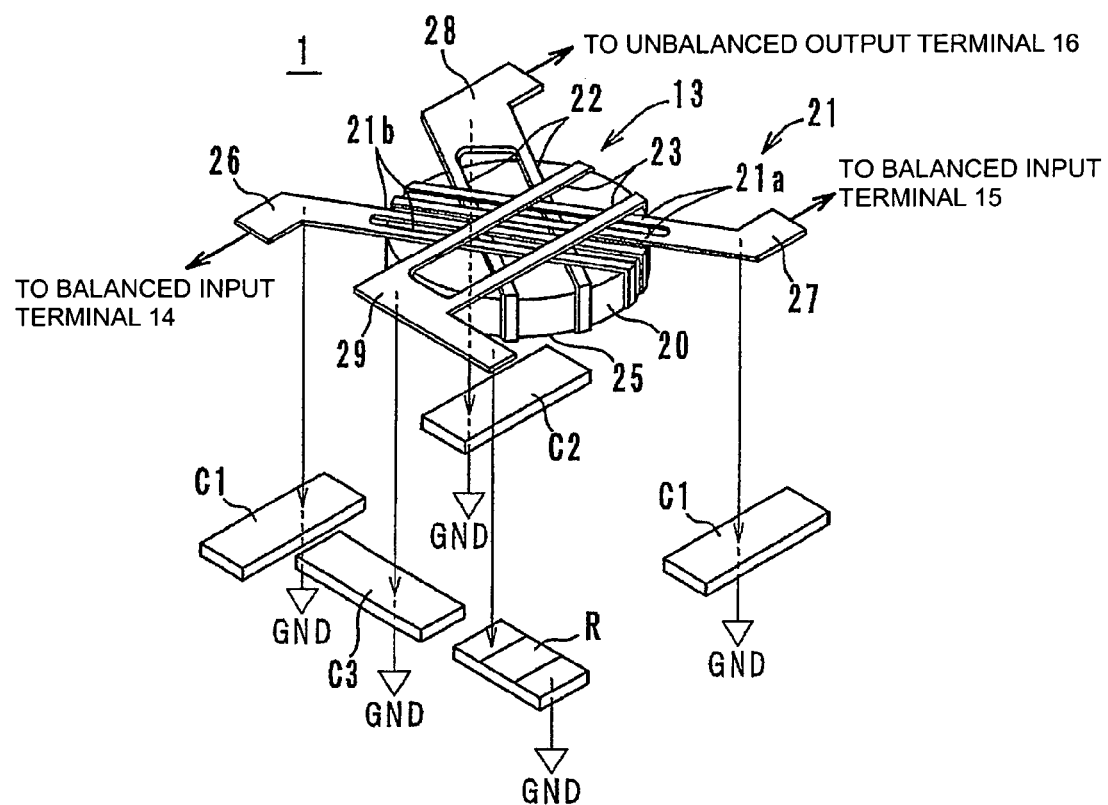
FIG. 3 is a schematic configuration view showing the internal connections of the three-port nonreciprocal circuit device shown in FIG. 1.

One end of the resistor R is connected to the hot-side capacitor electrode of the matching capacitor C3 via the connection portion 29 of the center electrode 23, and the other end is connected to the ground extracting electrode portion 17a exposed at the bottom portion 3b of the resin terminal casing 3. That is, the matching capacitor C3 and the resistor R are electrically connected in parallel between the connection portion 29 of the center electrode 23 and ground. FIG. 3 shows electrical connections inside the isolator 1.

The components having the above-described configuration are assembled, for example, as follows. As shown in FIG. 1, the lower metal casing 4 is attached to the resin terminal casing 3 from below. Next, the center-electrode assembly 13, the matching capacitors C1 to C3, the resistor R, and so on are accommodated in the resin terminal casing 3, and the upper metal casing 8 is attached. The permanent magnet 9 and the insulating member 7 are arranged between the upper metal casing 8 and the center-electrode assembly 13. The permanent magnet 9 applies a direct-current magnetic field H to the center-electrode assembly 13. The lower casing 4 and the upper casing 8 are joined into a metal casing, which defines a magnetic circuit and also functions as a yoke.

Figure 4:
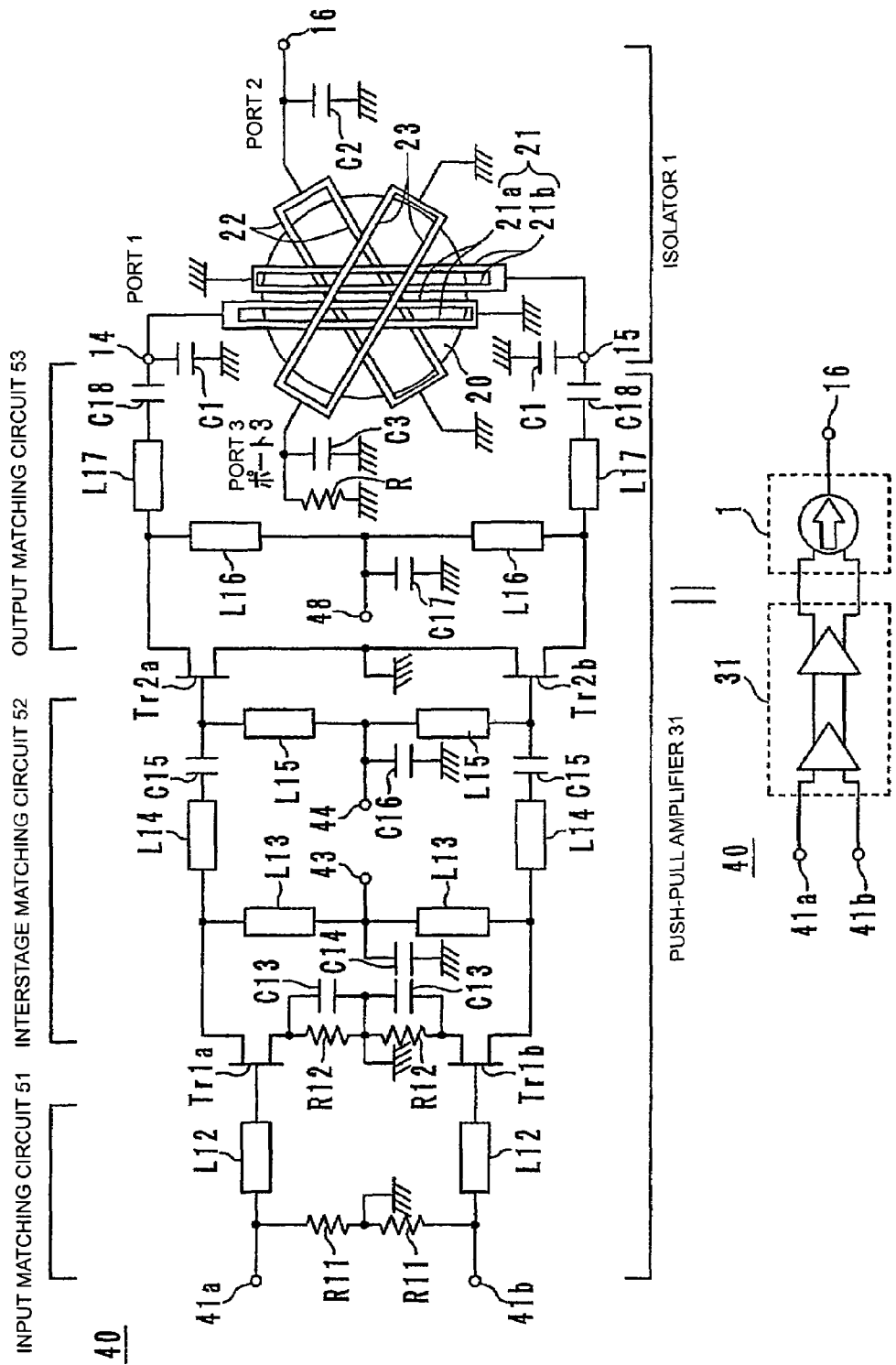
FIG. 4 is an electrical circuit diagram of a composite electronic component in which the three-port nonreciprocal circuit device shown in FIG. 1 is electrically connected to a push-pull amplifier.

FIG. 4 is an electrical circuit diagram of a composite electronic component 40 in which the isolator 1 and a push-pull amplifier 31, which operates at a phase difference of 180°, are electrically connected.

Two opposite ends (specifically, the connection portions 26 and 27) of the center electrode 21 in the isolator 1 act as power-supply terminals, and an input port 1 is connected to the center electrode 21 and acts as a balanced input port. The balanced input port 1, which is connected to the center electrode 21 in the isolator 1, is electrically connected to a balanced output side of the push-pull amplifier 31. An output port 2 is connected to the center electrode 22 in the isolator 1 and acts as an unbalanced output port. A port 3 is connected to the center electrode 23 in the isolator 1 and acts as a termination port.

On the other hand, the push-pull amplifier 31 has a structure in which one pair of amplifier devices, i.e., transistors Tr1a and Tr1b, and one pair of amplifier devices, i.e., transistors Tr2a and Tr2b, are connected at two stages. For example, bipolar transistors, as well as field-effect transistors in this first embodiment, may be used as the transistors Tr1a to Tr2b.

The initial-stage transistors Tr1a and Tr1b are electrically connected to the final-stage transistors Tr2a and Tr2b via an interstage matching circuit 52. Bias circuits, which include resistors R12 and capacitors C13, are electrically connected to the sources of the initial-stage transistors Tr1a and Tr1b. The sources of the final-stage transistors Tr2a and Tr2b are electrically connected to ground.

The interstage matching circuit 52 includes inductors L14, capacitors C15, inductors L13, a capacitor C14, inductors L15, and a capacitor C16. The inductors L14 and the capacitors C15 are electrically connected in series between the drains of the initial-stage transistors Tr1a and Tr1b and the corresponding gates of the final-stage transistors Tr2a and Tr2b. The inductors L13 and the capacitor C14 are electrically connected between the drains of the initial-stage transistors Tr1a and Tr1b and a drain power-supply terminal 43 of the initial-stage transistors Tr1a and Tr1b. The inductors L15 and the capacitor C16 are electrically connected between the gates of the final-stage transistors Tr2a and Tr2b and a gate bias power-supply terminal 44 of the final-stage transistors Tr2a and Tr2b.

The initial-stage transistors Tr1a and Tr1b are electrically connected to balanced input terminals 41a and 41b via an input matching circuit 51. The input matching circuit 51 includes inductors L12 and resistors R11. The inductors L12 are electrically connected in series between the gates of the initial-stage transistors Tr1a and Tr1b and the corresponding input terminals 41a and 41b, and the resistors R11 are electrically connected between the input terminals 41a and 41b and ground.

The final-stage transistors Tr2a and Tr2b are electrically connected to the balanced output terminals 14 and 15 of the push-pull amplifier 31 (in other words, to the balanced input terminals of the isolator 1) via an output matching circuit 53. The output matching circuit 53 includes inductors L17, capacitors C18, inductors L16, and capacitors C17. The inductors L17 and the capacitors C18 are electrically connected in series between the drains of the final-stage transistors Tr2a and Tr2b and the corresponding balanced output terminals 14 and 15 of the push-pull amplifier 31. The inductors L16 and the capacitors C17 are electrically connected between the drains of the final-stage transistors Tr2a and Tr2b and a drain power-supply terminal 48 of the final-stage transistors Tr2a and Tr2b.

Next, the operation of the composite electronic component 40 having the above-described configuration will be described with reference to equivalent circuit diagrams shown in FIGS. 5 to 8.

Figure 5:
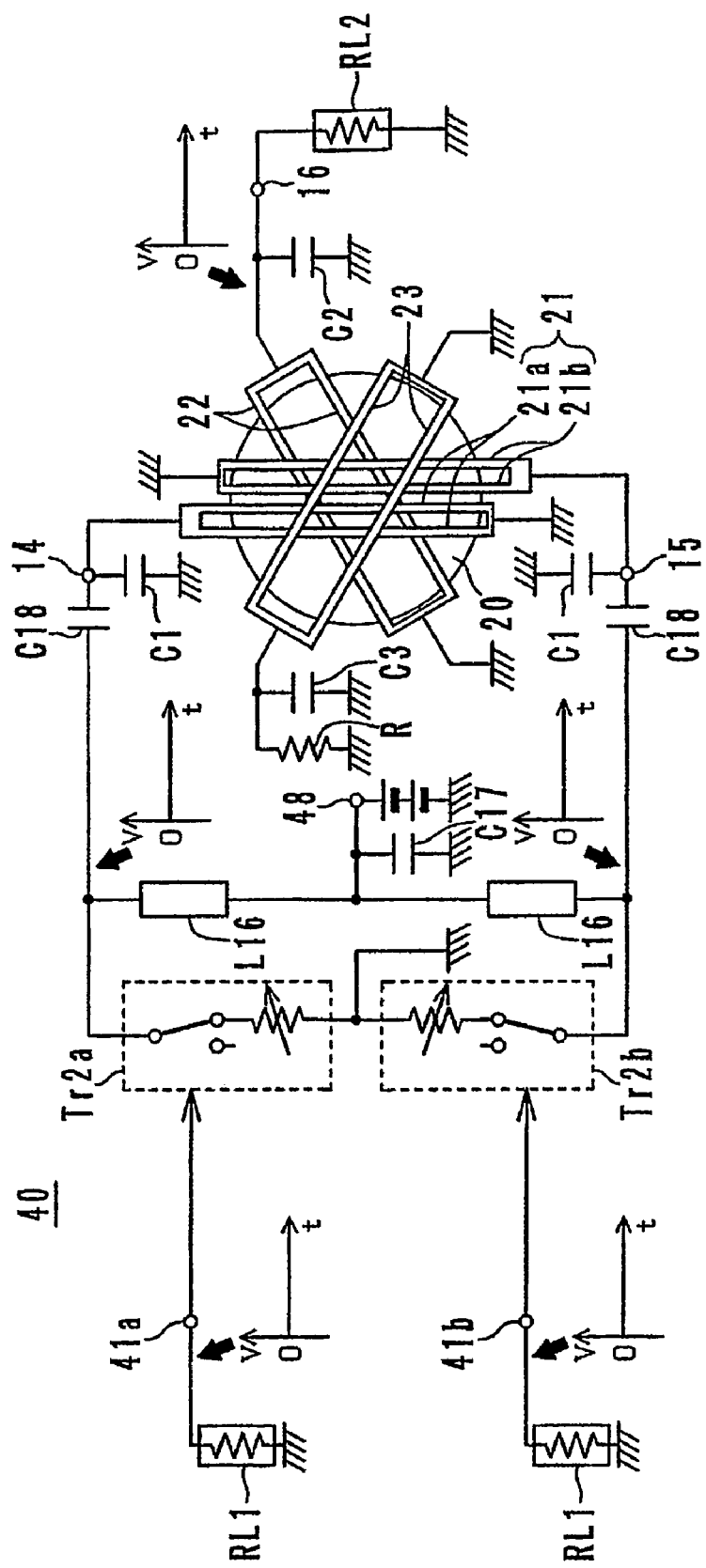
FIG. 5 is an electrical circuit diagram illustrating the operation of the composite electronic component shown in FIG. 4.

FIG. 5 shows a state in which the setting is such that some amount of idling current in the absence of an input signal (i.e., some amount of bias current during a no signal period) flows. That is, both of the transistors Tr2a and Tr2b are in ON states. With this setting, significantly low output-signal distortion can be expected. In FIG. 5, reference characters RL1 indicate input load resistors and reference character RL2 indicates an output load resistor.

Figure 6:
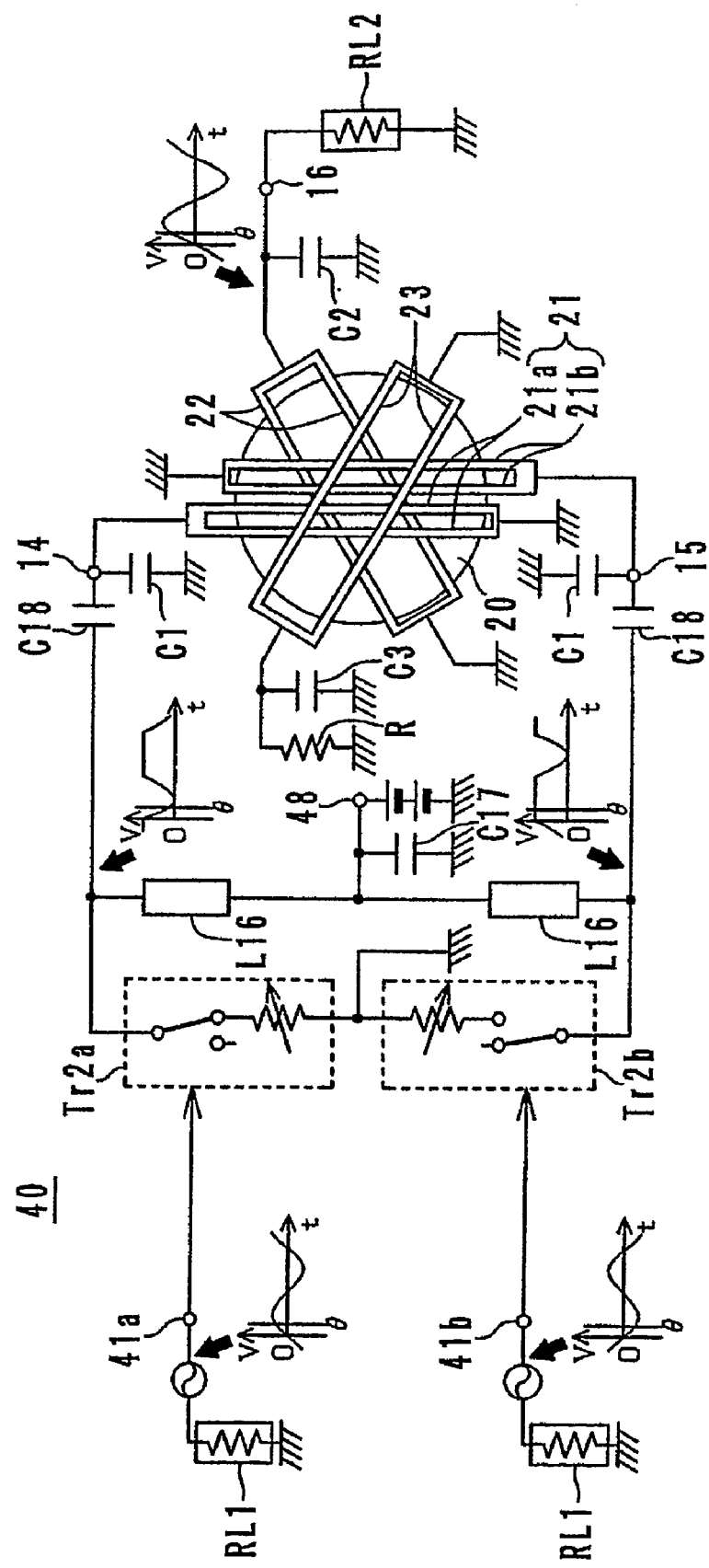
FIG. 6 is an electrical equivalent circuit diagram illustrating the operation of the composite electronic component shown in FIG. 4.

FIG. 6 shows a state in which balanced signal having a phase difference of 180° are input between the balanced input terminals 41a and 41b and the phase difference of the balanced signals is θ°. When the balanced signals are input to the terminating transistors Tr2a and Tr2b, respectively, the transistor Tr2a is put into the ON state and the transistor Tr2b is put into the OFF state. Current flowing through the transistor Tr2a flows through the first line conductor 21a of the center electrode 21, to thereby cause the ferrite 20 to generate a high-frequency magnetic field. At this point, the second line conductor 21b is open since the transistor Tr2b is in the OFF state and the cold end of the first line conductor 21a is connected to ground. Thus, regardless of the state of the second line conductor 21b, the ferrite 20 constantly generates a high-frequency magnetic field. This high-frequency magnetic field causes current to flow through the center electrode 22, which is electromagnetically coupled with the first line conductor 21a. As a result, the balanced signals are transmitted from the balanced input terminals 41a and 41b to an unbalanced output terminal 16.

Figure 7:
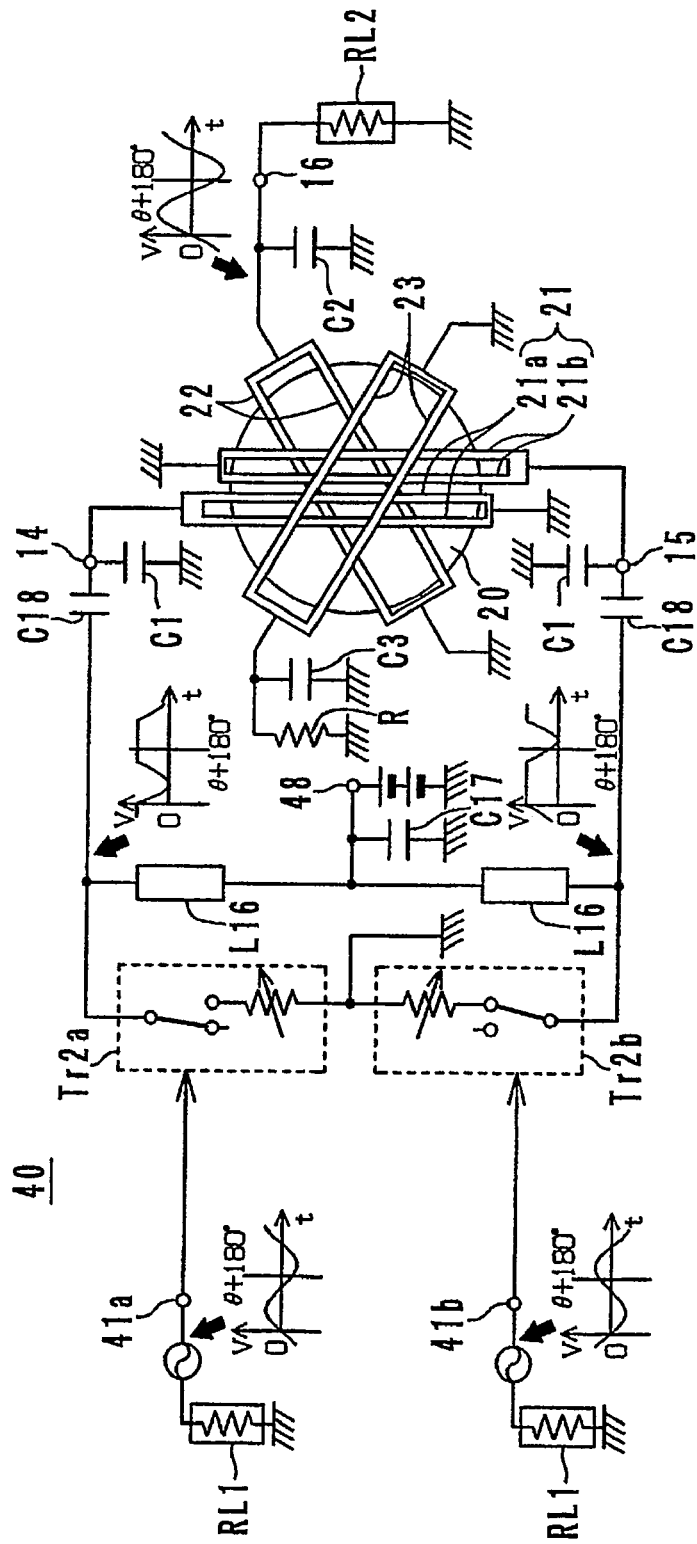
FIG. 7 is an electrical equivalent circuit diagram illustrating the operation of the composite electronic component shown in FIG. 4.

FIG. 7 shows a state in which the phases of the balanced signals are θ+180°. When the balanced signals are input to the terminating transistors Tr2a and Tr2b, respectively, the transistor Tr2a is put into the OFF state and the transistor Tr2b is put into the ON state. Thus, current flowing through the transistor Tr2b flows through the second line conductor 21b of the center electrode 21, to thereby cause the ferrite 20 to generate a high-frequency magnetic field. This high-frequency magnetic field causes current to flow through the center electrode 22, which is electromagnetically coupled with the second line conductor 21b. Consequently, the balanced signals are transmitted from the balanced input terminals 41a and 41b to the unbalanced output terminal 16.

As described, the cold ends of the first and second line conductors 21a and 21b of the input-side center electrode 21 are connected to ground independently from each other. Thus, even when the push-pull amplifier 31 connected to the balanced input port 1 is operated at a low operating point equivalent to class B or lower (i.e., even when not all waves are amplified), the ferrite 20 can reliably generate a high-frequency magnetic field.

Conversely, when an unbalanced signal is input to the unbalanced output terminal 16, current flows through the center electrode 22 and the ferrite 20 generates a high-frequency magnetic field. This high-frequency signal causes current to flow through the center electrode 23, which is magnetically coupled with the center electrode 22. The current that flowed through the center electrode 23 flows through the terminating resistor R, where the majority of power is consumed and the resulting electricity flows to ground. Thus, almost no unbalanced signal is transmitted from the unbalanced output terminal 16 to the balanced output terminals 41a and 41b.

Figure 8:
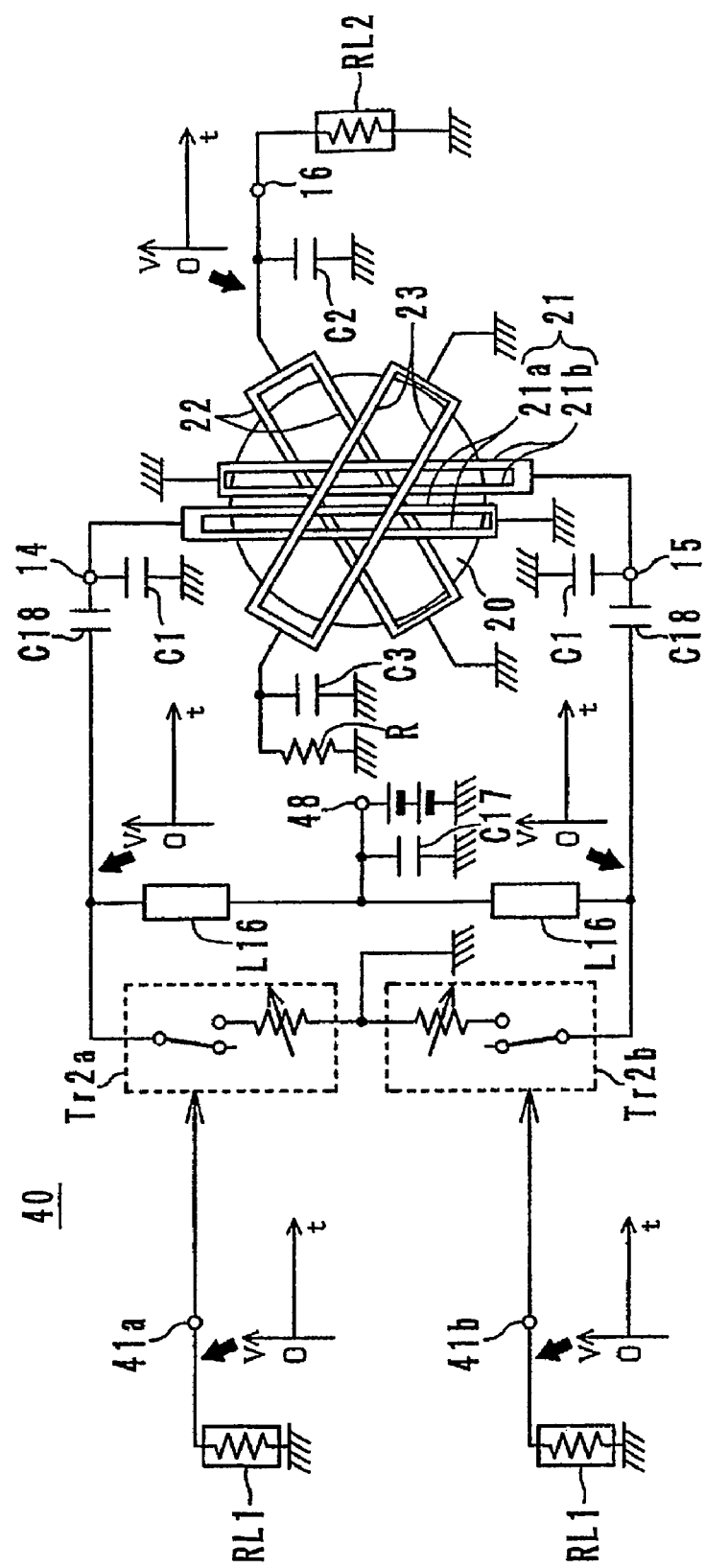
FIG. 8 is an electrical equivalent circuit diagram illustrating the operation of the composite electronic component shown in FIG. 4.
Figure 9:
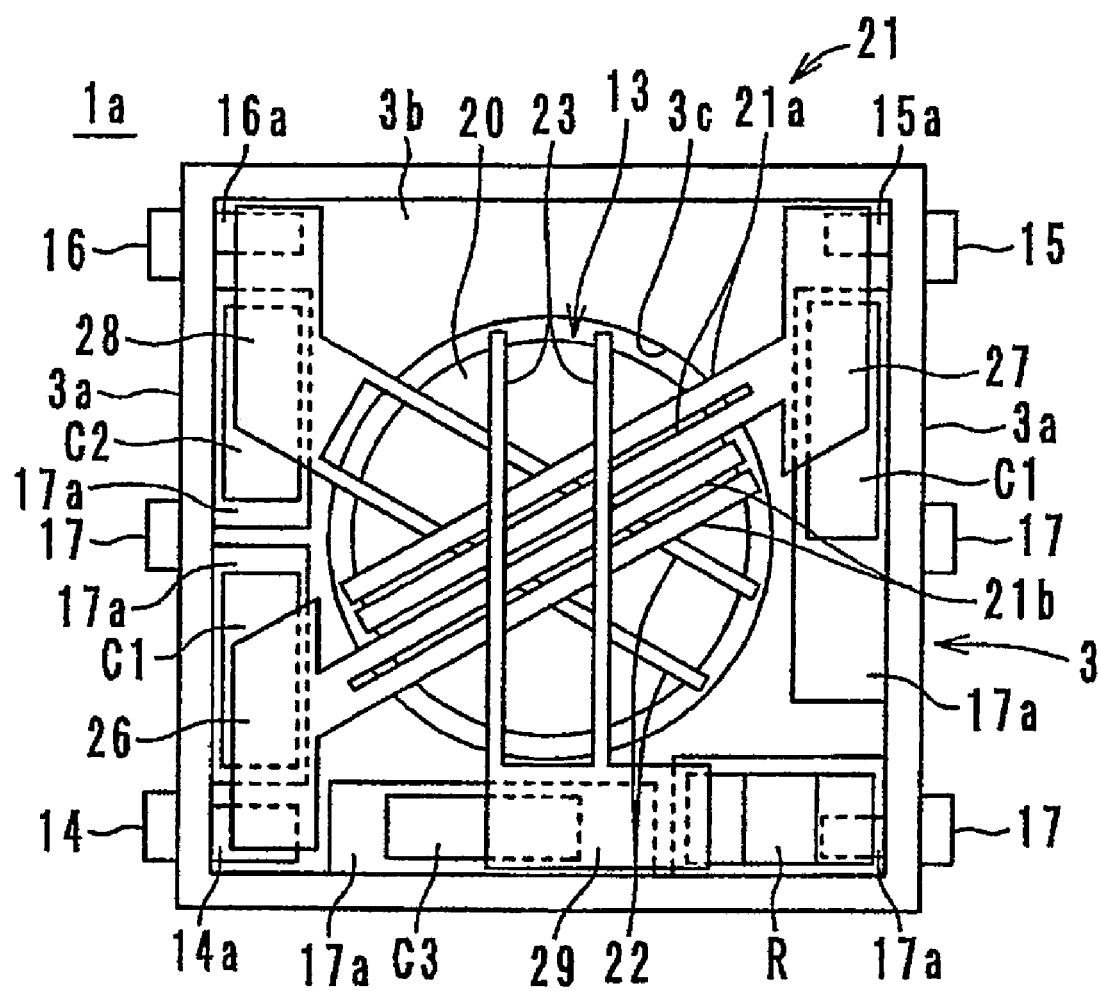
FIG. 9 is an internal plan view showing a modification of the three-port nonreciprocal circuit device shown in FIG. 1.

FIG. 8 shows a state in which the setting is such that almost no idling current in the absence of an input signal (i.e., almost no bias current during a no-signal period) flows. That is, both of the transistors Tr2a and Tr2b are in the OFF states. In this setting, while the efficiency is slightly increased, the output signal distortion is slightly increased.

This isolator 1 can be connected to the output side of the push-pull amplifier 31 (an unbalanced output circuit) without a balanced-to-unbalanced converter, such as a balun or hybrid, interposed therebetween. This can reduce the size and cost of the composite electronic component 40. Further, since a balun, hybrid, or the like can be omitted, it is possible to provide a composite electronic component 40 having low insertion loss, low unwanted radiation, and a large available frequency band.

Also, adjusting the electrostatic capacity value of the matching capacitors C1, which provide electrical connections between the connection portions 26 and 27 located at two opposite ends of the center electrode 21 for the balanced input ports 1 and corresponding grounds, can adjust the operating center frequency of a transmission circuit section to an intended frequency. Further, since two-opposite ends of the center electrodes 21 are not electrically connected via a capacitor in this configuration, unwanted parasitic inductance components associated with lead lines and so on does not generate.

It is preferable that the electrical length of the center electrodes 21 to 23 is set to be one-half the wavelength. When the electrical length of the center electrode 21 for the balanced port 1, in other words, the electrical length from the hot ends to the cold ends of the first and second line conductors 21a and 21b, is set to one-half the wavelength, the impedance between the connection portions 26 and 27 at two opposite ends of the center electrode 21 becomes infinite and the reactance interposed between the balanced transmission lines becomes infinite. That is, there is no need to connect a matching capacitor to the center electrode 21. When the reactance interposed between the balanced transmission lines is close to infinite, the degree of impedance conversion performed by the matching capacitor is reduced and the operating band of the isolator is also increased.

In addition, setting the line width of the first and second line conductors 21a and 21b of the center electrode 21 to be different from the electrode width of the other center electrodes 22 and 23 can achieve optimum impedance matching with the push-pull amplifier 31.

In particular, when the push-pull amplifier 31 is operated with power supply with a relatively low-voltage power supply, the impedance of the push-pull amplifier 31 is reduced, so that a large current flows through the center electrode 21. In this case, as an isolator 1a shown in FIG. 9, the line width of the line conductors 21a and 21b of the center electrode 21 for the balanced input port 1 is increased relative to the line width of the other center electrodes 22 and 23. This reduces the equivalent series resistance of the center electrode 21 and reduces the conductor loss of the center electrode 21, thereby making it possible to provide an isolator 1a having low insertion loss.

Also, when the push-pull amplifier 31 has the balanced input terminals 41a and 41b as in the first embodiment, connection with a SAW filter, a balanced buffer amplifier, an AGC amplifier, or a Gilbert-cell double-balanced mixer is facilitated. Further, since an unwanted signal input at the same phase is not amplified, this arrangement makes it difficult for an unwanted signal to be amplified. Thus, it is possible to eliminate provisions, such as a circuit required for removing unwanted waves.

Figure 10:
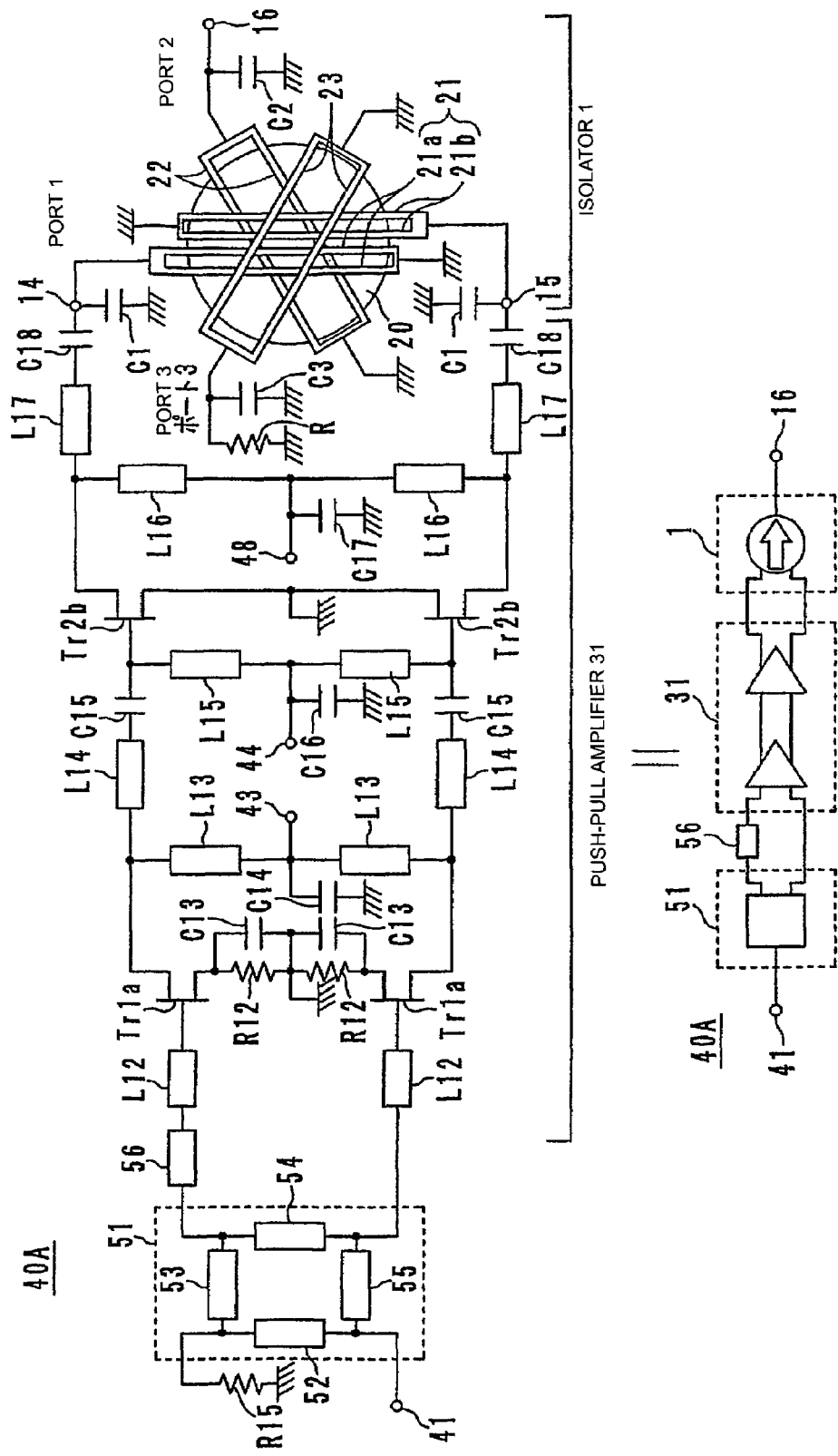
FIG. 10 is an electrical equivalent circuit diagram of another embodiment of the composite electronic component according to the present invention.

Second Embodiment, FIG. 10

FIG. 10 is an electrical circuit diagram of a composite electronic component 40A according to a second embodiment. In FIG. 10, reference numeral 51 indicates a hybrid coupler that is an unbalanced-to-balanced converter circuit and that has distributed-constant lines (strip lines) 52 to 55, and reference numeral R15 indicates a terminating resistor.

Two opposite ends (specifically, the connection portions 26 and 27) of the center electrode 21 in the isolator 1 act as power-supply terminals, and the input port 1, which is connected to the center electrode 21 in the isolator 1, acts as a balanced input port. The balanced input port 1, which is connected to the center electrode 21 in the isolator 1, is electrically connected to a balanced output side of the push-pull amplifier 31. A phase shifter 56 is connected in series with one balanced input end of the push-pull amplifier.

The composite electronic component 40A having the above-described configuration provides the same advantages as the composite electronic component 40 of the first embodiment. As in the second embodiment, when the input side of the push-pull amplifier 31 is an unbalanced type, connection with a dielectric filter, LC filter, helical filter, unbalanced buffer amplifier, or AGC amplifier can be facilitated. Also, since only one input terminal is required, a wiring and packaging area can be reduced and the configuration can be simplified.

The unbalanced-to-balanced converter circuit may be implemented with a passive circuit, including a power splitter, delay line, or balun, or may be implemented with active devices, such as bipolar transistors or field-effect transistors. In addition, it is preferable that the unbalanced-to-balanced converter circuit be integrated into a multilayer substrate. The unbalanced-to-balanced converter circuit integrated into the multilayer substrate is convenient since the operation thereof is stable and the matching capacitors C1 to C3 of the isolator 1 can also be integrated into the multilayer substrate.

Third to Seventh Embodiment, FIGS. 11 to 15

Figure 11:
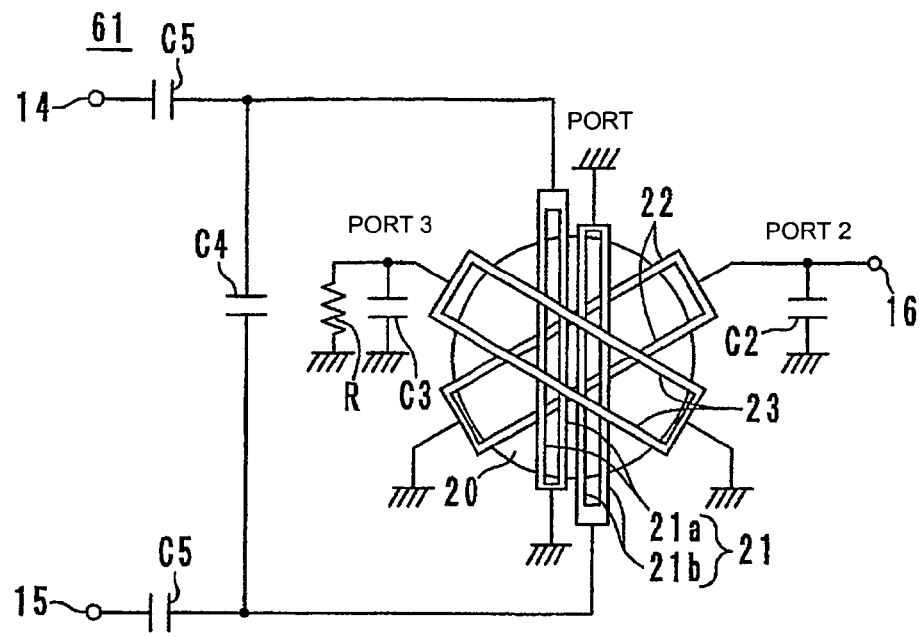
FIG. 11 is an electrical equivalent circuit diagram of another embodiment of the three-port nonreciprocal circuit device according to the present invention.

FIG. 11 is an electrical equivalent circuit diagram of an isolator 61 according to a third embodiment. In this isolator 61, the hot ends of the first and second line conductors 21a and 21b of the center electrode 21 act as power-supply terminals and a port 1 connected to those hot ends act as a balanced input port. A matching capacitor C4 is electrically connected between the hot end of the first line conductor 21a and the hot end of the second line conductor and matching capacitors C5 are electrically connected in series with the hot ends of the first and second line conductors 21a and 21b. Appropriately adjusting the electrostatic capacitance values of the matching capacitors C4 and C5 allows the operating center frequency of an electrical circuit (e.g., the transmission circuit section of a portable telephone) including the isolator 61 to be adjusted to an intended frequency. Additionally, it is possible to achieve impedance matching with a balanced output circuit having an output impedance greatly away from 50 Ω.

Figure 12:
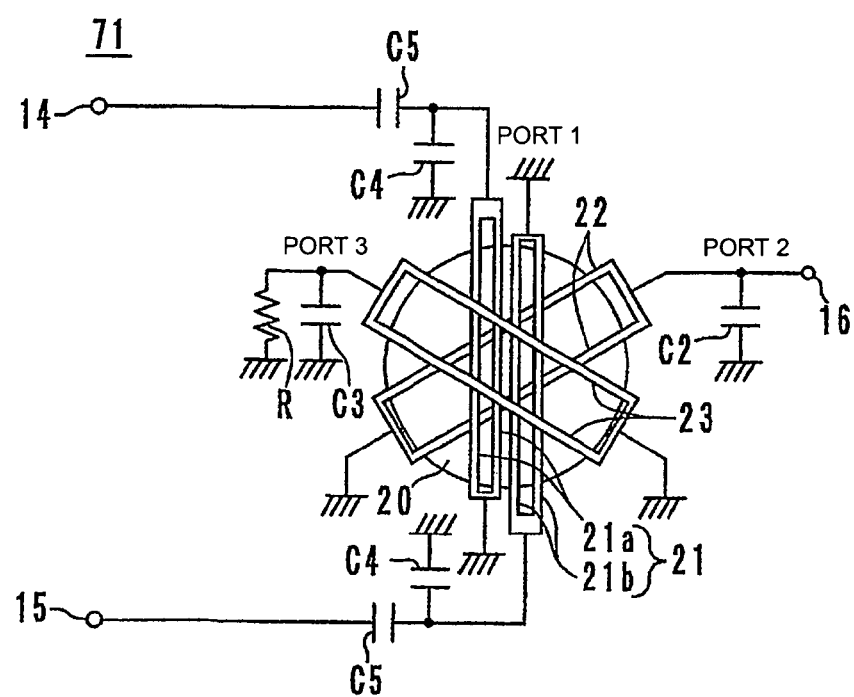
FIG. 12 is an electrical equivalent circuit diagram of still another embodiment of the three-port nonreciprocal circuit device according to the present invention.

FIG. 12 is an electrical equivalent circuit diagram of an isolator 71 according to a forth embodiment. In this isolator 71, matching capacitors C4 are electrically connected between the hot ends of first and second line conductors 21a and 21b of the center electrode 21 and corresponding grounds, and matching capacitors C5 are electrically connected in series with the hot ends of the first and second line conductors 21a and 21b, respectively. Appropriately adjusting the electrostatic capacitance values of the matching capacitors C4 and C5 allows the operating center frequency of a transmission circuit section to be adjusted to an intended frequency. Additionally, it is possible to achieve impedance matching with a balanced output circuit having an output impedance greatly away from 50 Ω.

Figure 13:
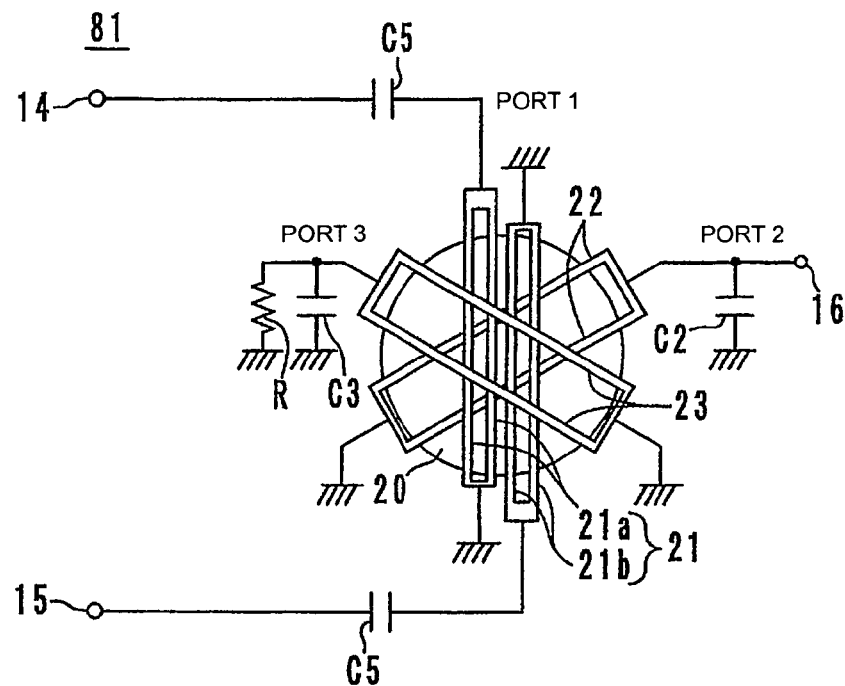
FIG. 13 is an electrical equivalent circuit diagram of still another embodiment of the three-port nonreciprocal circuit device according to the present invention.

FIG. 13 is an electrical equivalent circuit diagram of an isolator 81 according to a fifth embodiment. In this isolator 81, matching capacitors C5 are electrically connected between the hot ends of the first and second line conductors 21a and 21b of the center electrode 21 and the corresponding balanced input terminals 14 and 15. Appropriately adjusting the electrostatic capacitance values of the matching capacitors C5 can achieve impedance matching with a balanced output circuit having a low output impedance (e.g., 10 Ω or less).

Figure 14:
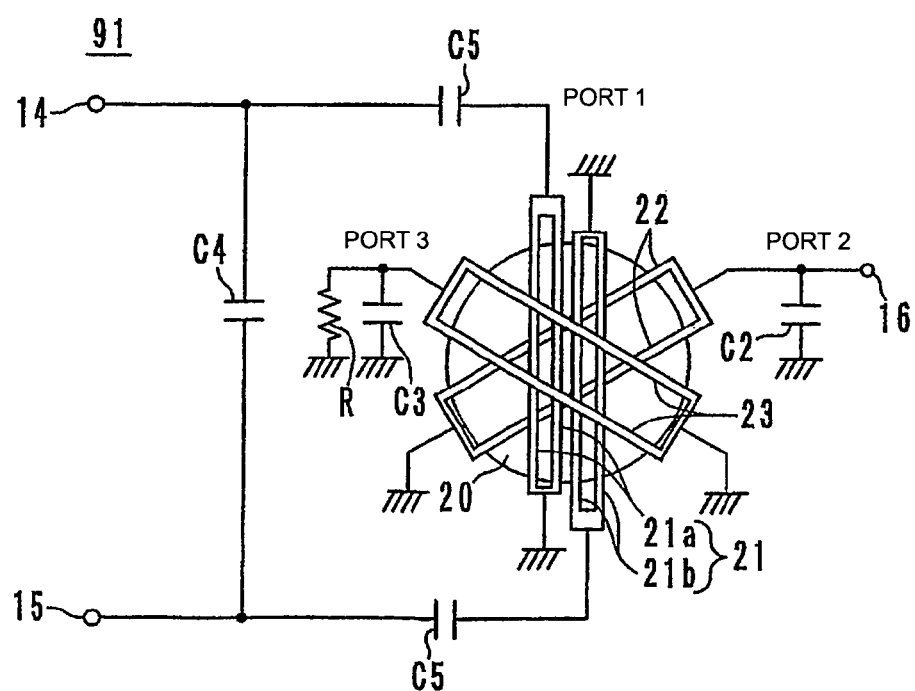
FIG. 14 is an electrical equivalent circuit diagram of yet another embodiment of the three-port nonreciprocal circuit device according to the present invention.

FIG. 14 is an electrical equivalent circuit diagram of an isolator 91 according to a sixth embodiment. In this isolator 91, matching capacitors C5 are electrically connected between the hot ends of the first and second line conductors 21a and 21b of the center electrode 21 and the corresponding balanced input terminals 14 and 15, and a matching capacitor C4 is electrically connected between the balanced input terminals 14 and 15. Appropriately adjusting the electrostatic capacitance values of the matching capacitors C4 and C5 allows the operating center frequency of a transmission circuit section to be adjusted to an intended frequency. Additionally, it is possible to achieve impedance matching with a balanced output circuit having an output impedance greatly away from 50 Ω.

Figure 15:
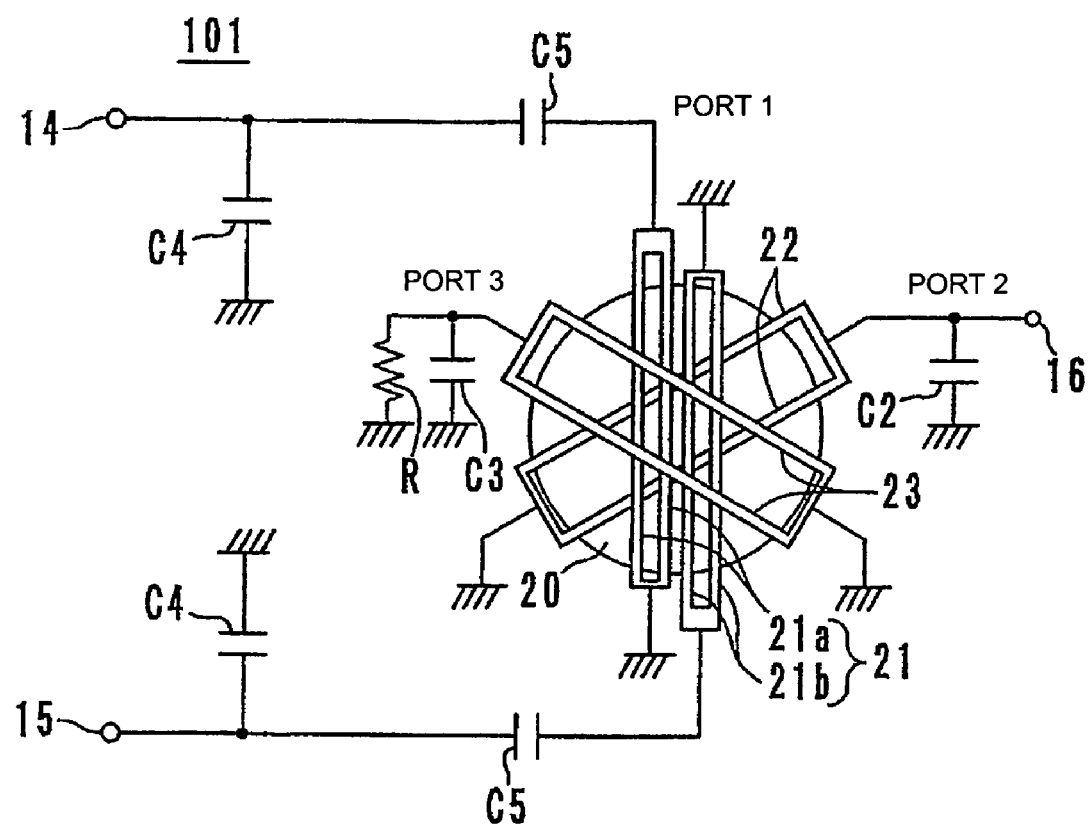
FIG. 15 is an electrical equivalent circuit diagram of a further embodiment of the three-port nonreciprocal circuit device according to the present invention.

FIG. 15 is an electrical equivalent circuit diagram of an isolator 101 according to a seventh embodiment. This isolator 101 has a configuration in which matching capacitors C4 are connected between the balanced input terminals 14 and 15 and corresponding grounds in the isolator 81 of the sixth embodiment shown in FIG. 13.

Figure 16:
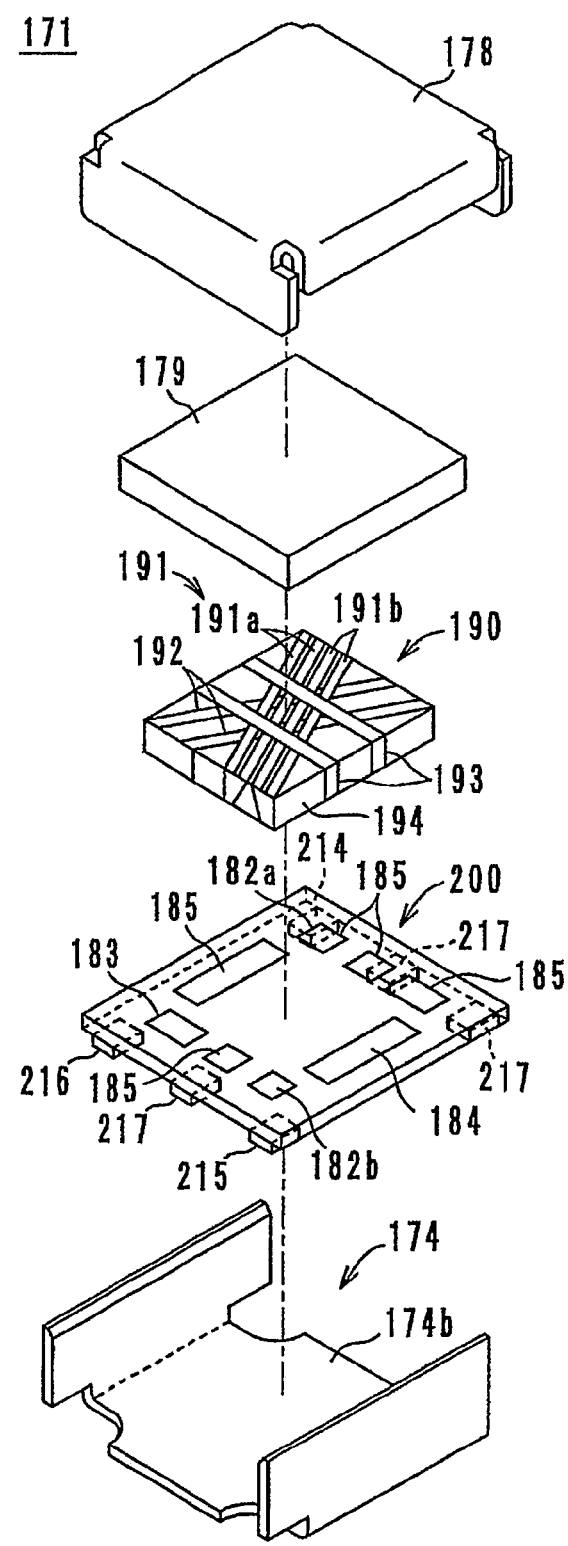
FIG. 16 is an exploded perspective view of a still further embodiment of the three-port nonreciprocal circuit device according to the present invention.

Eighth Embodiment, FIG. 16

As shown in FIG. 16, a three-port isolator 171 generally includes a metal casing defined by a lower metal casing 174 and an upper metal casing 178, a permanent magnet 179, a center electrode assembly 190, a rectangular multilayer substrate 200 that includes a terminating resistor R and matching capacitors C1 to C3.

In the center electrode assembly 190, center electrodes 191, 192, and 193 are arranged on the upper surface of a microwave ferrite 194, which has a rectangular shape in plan view, so as to cross one another by substantially 120° with an insulating layer (not shown) therebetween. In the eighth embodiment, each of the center electrodes 192 and 193 is constituted by two lines.

The center electrode 191 is constituted by a first line conductor 191a and a second line conductor 191b which are arranged parallel to each other. The first and second line conductors 191a and 191b are arranged such that the hot end of the first line conductor 191a and the cold end of the second line conductor 191b oppose each other and the cold end of the first line conductor 191a and the hot end of the second line conductor 191b oppose each other to cause electromagnetic coupling.

The center electrodes 191 to 193 may be attached to the ferrite 194 by using copper films or may be formed by printing a conductive paste containing Ag, Au, Ag—Pd, or Cu on the ferrite 194. The conductive paste contains a photosensitive resin. After the conductive paste is printed on the entire surface of the ferrite 194, the ferrite 194 is exposed to light and is subjected to development processing, unwanted portions are removed, and the resulting structure is fired. As a result, the thick-film center electrodes 191 to 193 having high positional accuracy are formed, and thus stable electrical characteristics are provided.

The multilayer substrate 200 includes a dielectric sheet having center-electrode hot-end connection terminals 182*a*, 182*b*, 183, and 184, center-electrode cold-end connection terminals 185, and so on; a dielectric sheet having capacitor electrodes, a resistor R, and so on on the surface; balanced input terminals 214 and 215; an unbalanced output terminal 216; ground terminals 217; and so on.

This multilayer substrate 200 is fabricated as follows. That is, the dielectric sheets are made of dielectric material that sinters at a low temperature. The dielectric material contains $Al_2O_3$ as the main component and contains one or more types of $SiO_2$, SrO, CaO, PbO, $Na_2O$, $K_2O$, MgO, BaO, $CeO_2$, and $B_2O_3$ as a sub-component.

In addition, shrink-restraining sheets, which do not sinter under the firing conditions (especially, at a firing temperature of 1000° C. or less) of the multilayer substrate 200, are formed to restrain firing shrinkage of the multilayer substrate 200 in the substrate plane direction (the X-Y direction) thereof. Material for the shrink-restraining sheets is a mixed material of alumina powder and stabilized zirconia powder.

The center-electrode connection electrodes 182*a* to 185 and the capacitor electrodes are formed on the dielectric sheets by a method such as screen printing or photolithography. For example, Ag, Cu, or Ag—Pd that has low resistivity and that can be fired concurrently with the dielectric sheets is used as material for the electrodes 182*a* to 185 and so on.

The resistor R is formed on a surface of the dielectric sheet by a method, such as screen printing. Cermet, carbon, ruthenium, or the like is used as material for the resistor R.

Signal via-holes are formed by pre-forming holes for via holes in the dielectric sheets by laser processing, punching, or the like, and then filling the holes with a conductive paste. Typically, as material for the conductive paste, material (Ag, Cu, Ag—Pd, or the like) that is the same as that for the electrodes 182*a* to 185 and so on is used.

The capacitor electrodes oppose each other with a corresponding dielectric sheet interposed therebetween to constitute the matching capacitors C1 to C3. These matching capacitors C1 to C3 and the terminating resistor R, together with the electrodes 182*a* to 185 and the signal via-holes, constitute an electrical circuit, which is similar to the isolator 1 shown in FIG. 4, within the multilayer substrate 200.

The dielectric sheets described above are stacked, the shrink-restraining sheets are further stacked on the upper and lower sides of the stack, and then the resulting structure is fired. As a result, a laminate is provided. Thereafter, unsintered shrink-restraining material is removed by supersonic cleaning or wet honing to thereby provide the multilayer substrate 200.

The balanced input terminals 214 and 215, the unbalanced output terminal 216, and the ground terminal 217 are arranged at the bottom surface of the multilayer substrate 200 so as to protrude therefrom. Ni plating of 1 to 10 µm is provided on surfaces of the thick-film terminals 214 to 217 and gold plating of 0.5 µm or less is further provided on those surfaces. The plating is intended to improve the solderability (solder wettability) of the terminals 214 to 217, prevent melting to solder (solder leading), and prevent migration.

The components described above are fabricated as follows. That is, the permanent magnet 179 is secured to the ceiling of the upper metal casing 178 with an adhesive. Ends of the center electrodes 191 to 193 of the center-electrode assembly 190 are soldered to the center-electrode connection electrodes 182*a* to 185 formed at the surface of the multilayer substrate 200, thereby mounting the center-electrode assembly 190 on the multilayer substrate 190.

The multilayer substrate 200 is placed on a bottom portion 174*b* of the lower metal casing 174, and a ground electrode provided at the reverse surface of the multilayer substrate 200 is fixed and electrically connected to the bottom portion 174*b* by soldering.

Since the center electrodes 191 to 193 and the multilayer substrate 200 in the isolator 171 are formed by screen printing or photolithography, a complicated circuit and wiring can be formed with high accuracy.

In the present embodiment, the first line conductor 191*a* and the second line conductor 191*b* of the center electrode 191 for the balanced input port are arranged adjacent to each other. Thus, there is a need to ensure that short-circuiting does not occur even with the adjacent arrangement and a characteristic variation due to a spacing variation between individual products does not occur. It is therefore effective to use the printing or photolithography technique to form the center electrodes 191 to 193 with high accuracy.

In generally, photolithography can form patterns with higher accuracy than printing. However, since a thin film suitable for photolithography has a small electrode thickness, the amount of loss is large in a frequency band of about 1 to 2 GHz. Accordingly, the method in which firing is performed after removing unwanted portions of unfired thick-film electrodes by a photolithography-based exposure/development technique is the most suitable for the formation of the center electrodes 191 to 193 in the isolator 171 of the eighth embodiment.

In the present embodiment, since the number of matching capacitors C1 to C3 is greater than the number in a typical isolator, the use of matching capacitors in the form of separate components increases the number components and the number of connection portions to thereby reduce the reliability, which is disadvantageous for miniaturization. However, integrating the push-pull amplifier 31 or some inductors and/or capacitors of the unbalanced-to-balanced converter or the like, connected to the input side of the push-pull amplifier 31, into the multilayer substrate 200 can provide a miniaturized, highly-reliable composite electronic component.

Figure 17:
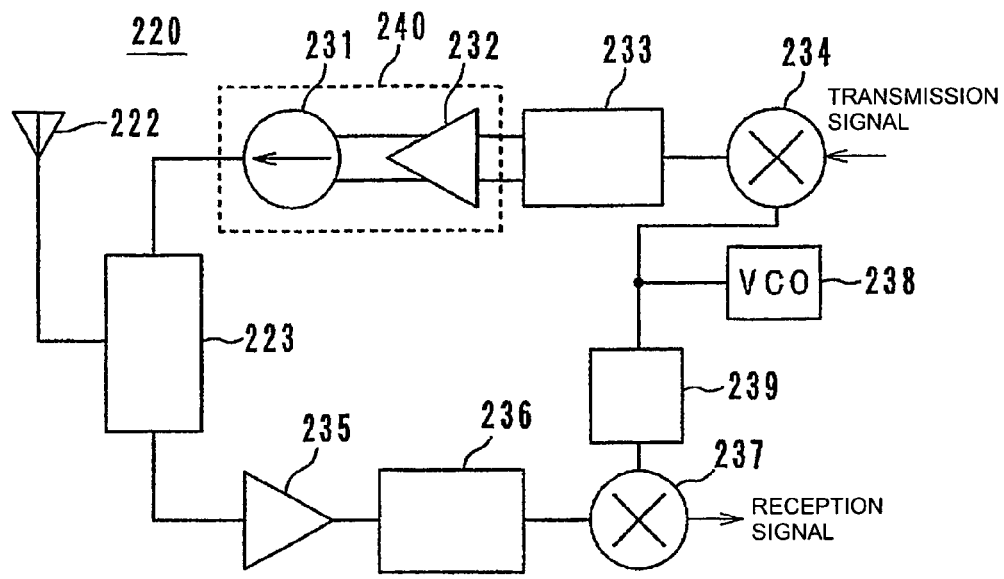
FIG. 17 is an electrical circuit block diagram of one embodiment of a communication apparatus according to the present invention.

Ninth Embodiment, FIG. 17

In a ninth embodiment, a communication apparatus according to the present invention will be described in the context of a portable telephone by way of example.

FIG. 17 is an electrical circuit block diagram of an RF section of a portable telephone 220. In FIG. 17, reference numeral 222 indicates an antenna device, 223 is a duplexer, 231 is a sending-side isolator, 232 is a sending-side power amplifier, 233 is a sending-side interstage bandpass filter, 234 is a sending-side mixer, 235 is a receiving-side power amplifier, 236 is a receiving-side interstage bandpass filter, 237 is a receiving-side mixer, 238 is a voltage controlled oscillator (VCO), and 239 is a local bandpass filter.

In this case, the composite electronic component 40 of the first embodiment or the composite electronic component 40*a* of the second embodiment is used as a composite electronic component 240. Incorporating the composite electronic component 240 can achieve a highly-reliable, compact, portable telephone 20 having improved electrical characteristics.

Other Embodiments

The present invention is not limited to the above-described embodiments, and thus various changes can be made thereto within the scope of the substance of the present invention. For example, the three-port nonreciprocal circuit device according to the present invention may be a three-port nonreciprocal circuit device included in a circulator or a coupler, other than an isolator.

Figure 18:
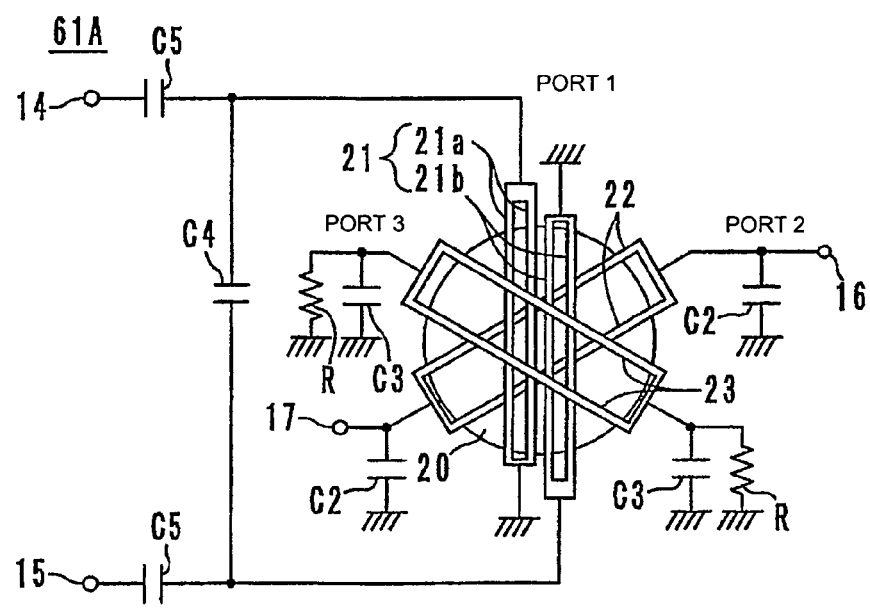
FIG. 18 is an electrical equivalent circuit diagram showing another embodiment.
Figure 19:
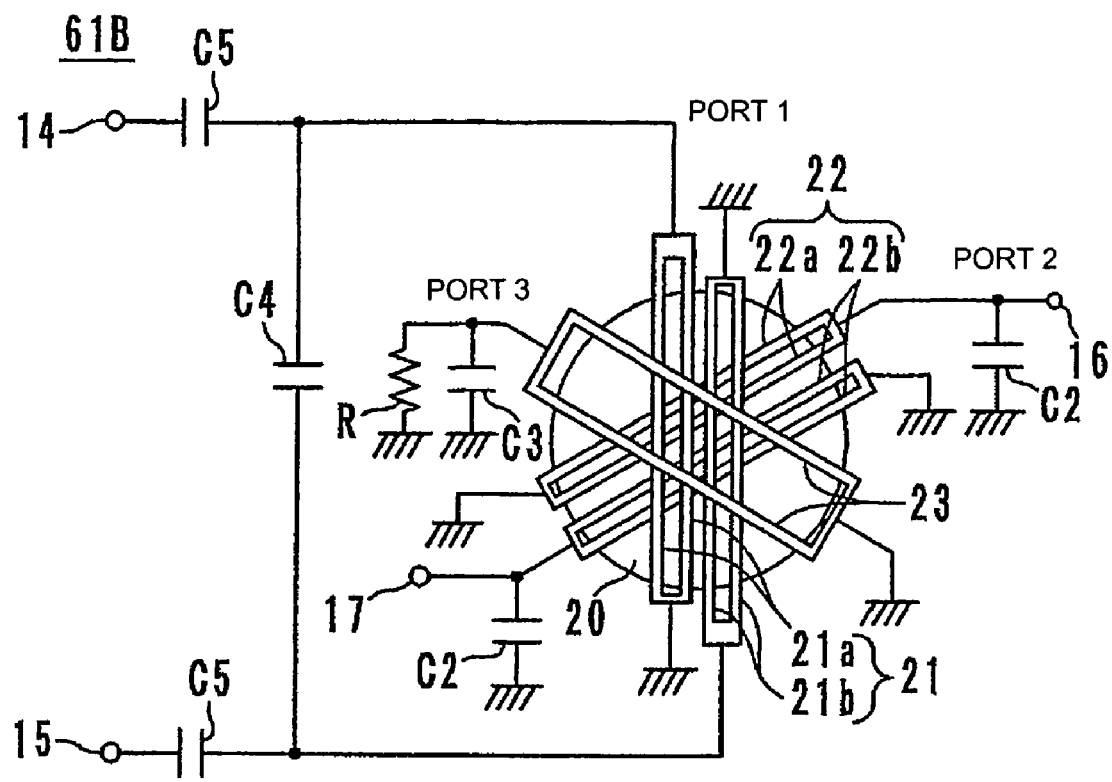
FIG. 19 is an electrical equivalent circuit diagram showing another embodiment.

Also, the center electrodes other than the center electrode for the balanced input port may be connected to balanced ports or may be connected to unbalanced ports. In this case, as in a three-point isolator 61A shown in FIG. 18, two opposite ends of the center electrodes 22 and 23, connected to balanced ports 2 and 3, may be configured as hot ends and the centers of the center electrodes 22 and 23 may be configured as virtual ground points (cold ends). Alternatively, as in a three-port isolator 61B shown in FIG. 19, a center electrode 22 connected to a balanced output port 2 may be constituted by a first line conductor 22a and a second line conductor 22b which are arranged substantially parallel to each other. Further, the arrangement may be such that the hot end of the first line conductor 22a and the cold end of the second line conductor 22b oppose each other and the cold end of the first line conductor 22a and the hot end of the second line conductor 22b oppose each other for electromagnetic coupling.

INDUSTRIAL APPLICABILITY

As described above, the present invention is effectively applicable to three-port nonreciprocal circuit devices, such as isolators, used in a microwave band; to composite electronic components for transmission circuits and so on including the nonreciprocal circuit devices; and to communication apparatuses, such as portable telephones. In particular, the present invention is superior in that the circuit device can be connected to a balanced output circuit without a balun, hybrid, or the like interposed therebetween and the ferrite is reliably excited even when operated at a low operating point.

The invention claimed is:

1. A three-port nonreciprocal circuit device comprising:
a permanent magnet;
a ferrite to which a direct-current magnetic field is applied by the permanent magnet; and
a first center electrode, a second center electrode, and a third center electrode arranged so as to cross one another in an electrically insulated state; and
at least one of the first to third center electrodes comprising a first line conductor and a second line conductor arranged substantially parallel to each other such that a hot end of the first line conductor and a cold end of the second line conductor oppose each other and a cold end of the first line conductor and a hot end of the second line conductor oppose each other to cause electromagnetic coupling,
wherein a port formed between the hot end of the first line conductor and the hot end of the second line conductor is a balanced port.

2. A communication apparatus, comprising at least one nonreciprocal circuit device according to claim 1.

3. The three-port nonreciprocal circuit device according to claim 1, wherein the electrical length from the hot end of the first line conductor to the hot end of the second line conductor of the first center electrode is substantially one-half a wavelength.

4. The three-port nonreciprocal circuit device according to claim 1, having a matching capacitor in an electrical connection between at least one of (a) the hot end of the first line conductor and the hot end of the second line conductor and (b) the hot end of the first line conductor and a ground and the hot end of the second line conductor and a ground.

5. The three-port nonreciprocal circuit device according to claim 1, having a first matching capacitor electrically connected in series with the hot end of the first line conductor and a second matching capacitor electrically connected in series with the hot end of the second line conductor.

6. A composite electronic component comprising an output circuit electrically connected to a three-port nonreciprocal circuit device according to claim 1.

7. The three-port nonreciprocal circuit device according to claim 1, wherein the first and at least one other center electrode comprises first and second line conductors, and the width of each line of the first line conductor and the second line conductor of the first center electrode is different from the widths of lines of the other center electrodes.

8. The three-port nonreciprocal circuit device according to claim 7, wherein the width of each line of the first line conductor and the second line conductor of the first center electrode is greater the widths of the lines of the other center electrodes.

9. The three-port nonreciprocal circuit device according to claim 1, wherein that each of the first line conductor and the second line conductor is constituted by at least two lines.

10. The three-port nonreciprocal circuit device according to claim 9, wherein the first and at least one other center electrode comprises first and second line conductors, and the width of each line of the first line conductor and the second line conductor of the first center electrode is different from the widths of lines of the other center electrodes.

11. The three-port nonreciprocal circuit device according to claim 10, wherein the width of each line of the first line conductor and the second line conductor of the first center electrode is greater the widths of the lines of the other center electrodes.

12. The three-port nonreciprocal circuit device according to claim 11 wherein the electrical length from the hot end of the first line conductor to the hot end of the second line conductor of the first center electrode is substantially one-half a wavelength.

13. The three-port nonreciprocal circuit device according to claim 12, having a matching capacitor in an electrical connection between the hot end of the first line conductor and the hot end of the second line conductor.

14. The three-port nonreciprocal circuit device according to claim 12, having a first matching capacitor in an electrical connection between the hot end of the first line conductor and a ground and a second matching capacitor in an electrical connection between the hot end of the second line conductor and a ground.

15. The three-port nonreciprocal circuit device according to claim 12, having a first matching capacitor electrically connected in series with the hot end of the first line conductor and a second matching capacitor electrically connected in series with the hot end of the second line conductor.

16. The three-port nonreciprocal circuit device according to claim 14, having the hot end of the first line conductor and the hot end of the second line conductor electrically connected to balanced input/output terminals via respective matching capacitors and matching capacitors electrically connected between the balanced input/output terminals and corresponding grounds.

17. A composite electronic component comprising:
an amplifier driven at a phase difference of substantially 180° and having balanced output terminals; and
the nonreciprocal circuit device according to claim 1, the balanced port being connected to balanced output terminals of the amplifier.

18. A communication apparatus, comprising at least one composite electronic component according to claim 17.

19. A composite electronic component according to claim 17, wherein the amplifier has balanced input terminals.

20. The composite electronic component according to claim 19, wherein unbalanced input terminals are connected to balanced input terminals of the amplifier via an unbalanced-to-balanced converter circuit.

* * * * *